United States Patent

[11] 3,615,952

[72] Inventor Edmund Benjamin Davidson
Yardley, Pa.

[21] Appl. No. 867,907
[22] Filed Oct. 20, 1969
[45] Patented Oct. 26, 1971

[73] Assignee RCA Corporation

[54] PHOTORESIST COMPOSITION AND METHOD OF FORMING AND USING THE SAME
12 Claims, No Drawings

[52] U.S. Cl. .......... 156/13, 96/44, 96/88, 117/34, 156/17
[51] Int. Cl. .......... C23f 1/02, G03c 1/00
[50] Field of Search .......... 96/44, 88; 117/34; 156/13, 17, 18

[56] References Cited

UNITED STATES PATENTS

| | | | |
|---|---|---|---|
| 3,202,507 | 8/1965 | Sprague et al. | 96/44 X |
| 3,494,810 | 2/1970 | Skoda | 156/13 |
| 3,508,923 | 4/1970 | Pickard | 117/34 X |

*Primary Examiner*—William A. Powell
*Attorney*—Glenn H. Bruestle

ABSTRACT: A resist composition comprising an alkyd resin made by reacting together phthalic anhydride, pentaerythritol, trimethyl propane, tall oil fatty acid, and benzoic acid and then removing about 15–40 percent of the low molecular weight ends. The resist may be made photosensitive by adding a sensitizer.

PHOTORESIST COMPOSITION AND METHOD OF FORMING AND USING THE SAME

BACKGROUND OF THE INVENTION

Resists are substances that are resistant to the dissolving action of certain solvents. Resists may also be light sensitive in that exposure to some form of actinic radiation causes them to at least partially change chemically from one to the other of two alternative forms, one of which is resistant to certain solvents and the other of which is soluble in those solvents.

Most photoresists change from a soluble to an insoluble form when they are exposed to light. These are known as "-negative" photoresists because, just as for a silver halide emulsion, the areas of photoresist remaining after development of an image are those that have been exposed to light. Some photoresists are of the "positive" type. That is, when they are exposed to light they change from an insoluble to a soluble form and development of the photoresist then occurs where light has impinged on the surface.

Although some resists are photosensitive without the addition of other substances, most resists require the addition of a "sensitizer" to increase their light sensitivity to a level that is suitable for practical use.

Some previously used photoresists are based on polyvinyl cinnamates as the polymeric material that is changed in solubility when light strikes it. Others comprise rubber-based material, polyolefins or polyallyl orthophosphate.

Commonly used sensitizers for these resists comprise substances which include compounds containing cyano, amino, nitro, azido, ketone, quinone and anthrone groups.

Photoresists are generally used to provide a pattern of etch-resistant material on a substrate surface so that selected areas of the substrate surface can be etched. One example of this use is in the manufacture of some types of printed circuits. In this use, a uniform coating of photoresist is deposited on the surface of a sheet of copper foil laminated to a phenolic resin board. The coating is then exposed to a pattern of light and shadow which initiates a change of the resist where light has impinged. The board is then treated with a solvent to remove the soluble parts of the resist and then baked to complete image formation. The exposed portions of the copper foil may then be etched with a conventional etching solution to remove metal and leave behind the pattern of copper conductors desired.

In order to operate successfully as a photoresist material, a substance must have the necessary chemical properties which enable it to change readily to either a more soluble form or a more insoluble form. If it is to operate successfully as a resist, in general, it must adhere well to the substrate, be stable, and must be easy to handle. Adherence properties are particularly important since, if adherence is weak, and if an etching solution is used to define a pattern of the resist, the etching solution may undercut the resist and cause poor line definition. With the growing importance of applications having much more stringent resolution requirements, such as microminiature circuits and devices, a demand for resists that will provide the increased definition has arisen.

The present invention relates to an improved resist or photoresist having excellent adherence to silicon dioxide films as well as to metals such as tungsten, chromium and gold. It has been found useful both for etching with chemical reagents and for etching by means of RF sputtering.

EXAMPLE

In making the resist, an oil-modified alkyd resin is prepared by reacting together:

| | |
|---|---|
| Tall oil fatty acid (1% resin) | 25.0% by weight |
| Phthalic anhydride | 35.5% by weight |
| Pentaerythritol | 18.0 by weight |
| Trimethylol propane | 16.9% by weight |
| Benzoic acid | 4.6% by weight |

The ingredients are reacted at a temperature of about 200° C. until the product has an acid number of about 5–25.

The alkyd resin thus prepared in an amount of, for example, 225 gms., is heated with stirring to 200° C. for 1 hour under nitrogen, then cooled to 100° C. Methylcyclohexane in an amount of 900 ml. is added and the mixture is heated to reflux with stirring. After 1 hour, heating and stirring are discontinued and the supernatant liquid is decanted. The remaining imbibed solvent is removed by distillation, after which the recovered polymer, approximately 185 gms., is dissolved in the desired solvent, decanted and filtered.

The above-described treatment is for the purpose of removing the low-molecular weight ends of the alkyd resin. Preferably, about 15–40 percent of the original material should be removed.

To make up a photoresist material, the modified alkyd resin is dissolved in toluene or a mixture of toluene and xylene to make up a solution of about 20 percent solids. A sensitizer is then added in an amount of about 6 wt. percent of the resin. The sensitizer may be, for example, 2, 6-bis (para-azidobenzylidene)-4-methylcyclohexanone. Other suitable sensitizers are: benzoin, benzophenone, 2,3-butanedione, 4,4 4',4'-bis-(dimethylamino) benzophenone, benzoin methyl ether, 2-methylanthraquinone, and 2-chloranthraquinone. Mixtures of these may also be used.

These compositions can be used as etch resists as follows. A solution of the resist, prepared as above described, is spin coated, e.g. on an oxide-coated silicon wafer having a coating of about 28000 A. of silicon dioxide, at a speed of 7,000 r.p.m. After drying, an exposure is made through a photographic negative to a collimated light source utilizing a 200 watt high-pressure mercury lamp for 10–15 seconds.

The exposed layer is developed in butyl acetate to dissolve the nonexposed photoresist, and rinsed in a 1:1 solution of isopropyl alcohol and methyl cyclohexanone. The wafer is then baked 5–10 minutes at 200° C. and is ready for etching the exposed silicon oxide regions.

Etching is carried out using a conventional etching solution of hydrofluoric acid buffered with ammonium fluoride. Etching is continued for 20 minutes. At the end of this period the resist does not show any signs of fringing, lifting or undercutting. A similar wafer that had been coated with a commercial rubber-based photoresist would be badly undercut after a similar etching treatment.

Alternatively, the etching may be carried out by desputtering the surface in an RF sputtering apparatus. The resist described in this invention has been found unusually resistant to the conditions under which RF sputter etching is carried out so that high voltages can be employed, hastening the sputtering rate.

The resists of this invention also have excellent adherence to metals such as tungsten, chromium and gold. Conventional etching solutions can be used to etch patterns through films of these metals where the present materials are used as the etch resist. For example, in etching tungsten, an aqueous etching solution may be made up of equal parts of (i) 100 gms. per liter of $K_3Fe(CN)_6$, and (ii) 100 gms. per liter of KOH and the etching may be carried out at room temperature electrolytically using the tungsten as an anode, platinum as a cathode, and a current of 1–2 amps. at 4 volts. About 1–1.5 microns of tungsten can be removed in about 20 seconds. In etching chromium a composite etching solution may be made up of 1 part of a first solution made by dissolving 500 gms. NaOH in a liter of water and 3 parts of a second solution made by dissolving 1000 gms. $K_3Fe(CN)_6$ in 3 liters of water. Etching is preferably carried out at 40° C.

The oil-modified alkyd resin, prepared as previously described but without the added photosensitizer, may also be used as a sputter etching resist. In this case, a pattern of the resist may be defined using a conventional photoresist.

First, the unsensitized alkyd resin is dissolved in a 3:1 mixture of toluene-xylene to make up a 22 percent by weight solution. A silicon wafer, which has had a layer of silicon dioxide formed thereon, is coated with this solution and the solvent is removed by evaporation.

Next, the layer of alkyd resin is overcoated by applying a solution comprising 10 ml. of 10 percent by weight polyvinyl alcohol (PVA) in water, sensitized with 5 drops of a 10 percent by weight solution of ammonium dichromate. This provides a photosensitized resin layer when the water is evaporated.

The photosensitive layer is then exposed through a mask and developed in water. The unexposed portions of the PVA-dichromate layer are dissolved but the oil-modified alkyd resin underneath is left untouched by the aqueous developer.

Now, the uncovered alkyd resin is dissolved with a 1:1 mixture of methylcyclohexane and toluene. At this point, the PVA-dichromate layer may either be removed or left in place and the silicon dioxide which has been uncovered by removal of the alkyd resin, can be removed by conventional sputter etching. The oil-modified alkyd resin, without the photosensitizer, has been found to be unusually resistant to sputter etching.

Positive-acting photoresists can also be used to define a masking pattern in the oil-modified alkyd resin layer. For example, Shipley Co. positive photoresist No. 1350, applied over the alkyd resin layer, exposed, and then developed with aqueous alkali will also bare the underlying alkyd resin without dissolving it so that the alkyd resin can later be developed with the 1:1 methylcyclohexane and toluene mixture.

I claim:

1. A photoresist material comprising an oil-modified alkyd resin made by reacting together:

| | |
|---|---|
| Tall oil fatty acid (1% resin) | 25.0% |
| Phthalic anhydride | 35.5% |
| Pentaerythritol | 18.0% |
| Trimethylol propane | 16.9% |
| Benzoic acid | 4.6% |

until the reaction material has an acid number of 5–25, and fractionating the reacted material until about 15–40 percent of the original material, comprising the low-molecular weight ends, has been removed, a photosensitizer in an amount of about 6 percent by weight of modified resin and a solvent for the resin.

2. A photoresist material according to claim 1 in which said solvent is xylene.

3. A photoresist material according to claim 1 in which said photosensitizer is 2,6-bis(para-azidobenzylidene)-4-methylcyclohexanone.

4. A method of making a photoresist material comprising reacting together:

| | |
|---|---|
| Tall oil fatty acid (1% resin) | 25.0% |
| Phthalic anhydride | 35.5% |
| Pentaerythritol | 18.0% |
| Trimethylol propane | 16.9% |
| Benzoic acid | 4.6% |

until the reaction material has an acid number of 5–25, and then heating the reacted material to 200° C. for 1 hour under nitrogen, cooling to 100° C., extracting in methylcyclohexane, heating to reflux for 1 hour, removing the remaining solvent and adding a photosensitizer.

5. A method according to claim 4 in which the sensitizer is benzoin.

6. A method of etching a surface which includes applying a photoresist thereto, exposing the photoresist to a pattern of actinic radiation, developing the exposed photoresist to remove portions thereof thereby exposing parts of said surface, and etching the exposed parts with an etching fluid, wherein said photoresist comprises an oil-modified alkyd resin made by reacting together:

| | |
|---|---|
| Tall oil fatty acid (1% resin) % | 25.0% tb resin)tb Phthalic anhydride |
| Pentaerythritol | 18.0% |
| Trimethylol propane | 16.9% |
| Benzoic acid | 4.6% |

until the reaction material has an acid number of 5–25, and fractionating the reacted material until about 15–40 percent of the original material, comprising the low molecular weight ends, has been removed, and a photosensitizer.

7. A method according to claim 6 in which the surface being etched is silicon dioxide and said etching fluid is a buffered solution of hydrofluoric acid.

8. A method according to claim 6 in which the surface being etched is tungsten and the etching is carried out anodically.

9. A method according to claim 6 in which the surface being etched is chromium and the etching solution comprises sodium hydroxide and $K_3Fe(CN)_6$.

10. A method of defining patterns in a thin surface layer comprising coating said surface layer with a photoresist, exposing the photoresist to a pattern of actinic radiation, developing the exposed photoresist to remove portions thereof thereby exposing parts of said surface layer, and etching said exposed parts by RF sputtering techniques, wherein said photoresist comprises a sensitized oil-modified alkyd resin made by reacting together:

| | |
|---|---|
| Tall oil fatty acid (1% resin) | 25.0% |
| Phthalic anhydride | 35.5% |
| Pentaerythritol | 18.0% |
| Trimethylol propane | 16.9% |
| Benzoic acid | 4.6% |

until the reaction material has an acid number of 5–25, and fractionating the reacted material until about 15–40 percent of the original material, comprising the low molecular weight ends, has been removed, and a photosensitizer.

11. A method of making an etched pattern in a substrate comprising:

a. coating said substrate with a layer of a resist comprising an oil-modified alkyd resin made by reacting together:

| | |
|---|---|
| Tall oil fatty acid (1% resin) | 25.0% |
| Phthalic anhydride | 35.5% |
| Pentaerythritol | 18.0% |
| Trimethylol propane | 16.9% |
| Benzoic acid | 4.6% |

until the reaction material has an acid number of 5–25, and fractionating the reacted material until about 15–40 percent of the original material, comprising the low molecular weight ends, has been removed, b. defining a pattern in said layer by dissolving unwanted portions thereof, thereby exposing portions of said substrate, and c. etching said unmasked substrate portions by radio frequency sputter etching to form in said substrate an etched pattern corresponding to those parts of said resist layer which were removed.

12. A method according to claim 11 in which said alkyd resin layer is covered with a photoresist, said photoresist is developed with a solvent that does not dissolve said alkyd resin to uncover portions of said alkyd resin layer, and said uncovered alkyd resin layer portions are subsequently dissolved to uncover corresponding portions of said substrate.

* * * * *

UNITED STATES PATENT OFFICE

CERTIFICATE OF CORRECTION

Patent No. 3,615,952 Dated October 26, 1971

Inventor(s) Edmund Benjamin Davidson

It is certified that error appears in the above-identified patent and that said Letters Patent are hereby corrected as shown below:

Column 4, claim 6, lines 3, 4, and 5 should read as follows:

| | |
|---|---|
| Tall oil fatty acid (1% resin) | 25.0% |
| Phthalic anhydride | 35.5% |

Signed and sealed this 21st day of March 1972.

(SEAL)
Attest:

EDWARD M.FLETCHER,JR.
Attesting Officer

ROBERT GOTTSCHALK
Commissioner of Patents

RM PO-1050 (10-69)

USCOMM-DC 60376-P69
☆ U.S. GOVERNMENT PRINTING OFFICE : 1969 O—366-334